(12) United States Patent
Rizel et al.

(10) Patent No.: US 9,672,925 B2
(45) Date of Patent: Jun. 6, 2017

(54) STORAGE IN CHARGE-TRAP MEMORY STRUCTURES USING ADDITIONAL ELECTRICALLY-CHARGED REGIONS

(71) Applicant: Apple Inc., Cupertino, CA (US)

(72) Inventors: Arik Rizel, Hod Hasharon (IL); Avraham Poza Meir, Rishon le-Zion (IL); Yael Shur, Tel Aviv (IL); Eyal Gurgi, Petah-Tikva (IL); Barak Baum, Givatayim (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/066,020

(22) Filed: Mar. 10, 2016

(65) Prior Publication Data

US 2016/0189783 A1    Jun. 30, 2016

Related U.S. Application Data

(63) Continuation of application No. 14/457,380, filed on Aug. 12, 2014, now Pat. No. 9,312,017.

(60) Provisional application No. 61/927,593, filed on Jan. 15, 2014.

(51) Int. Cl.
| | | |
|---|---|---|
| *G11C 16/24* | (2006.01) |
| *G11C 16/26* | (2006.01) |
| *G11C 16/10* | (2006.01) |
| *G11C 11/56* | (2006.01) |
| *G11C 16/04* | (2006.01) |
| *H01L 29/423* | (2006.01) |
| *H01L 27/11568* | (2017.01) |

(52) U.S. Cl.
CPC .......... *G11C 16/24* (2013.01); *G11C 11/5671* (2013.01); *G11C 16/0466* (2013.01); *G11C 16/0475* (2013.01); *G11C 16/10* (2013.01); *G11C 16/26* (2013.01); *H01L 27/11568* (2013.01); *H01L 29/42328* (2013.01)

(58) Field of Classification Search
CPC ............................ G11C 16/24; G11C 16/0466
USPC ....................................... 365/185.18
See application file for complete search history.

(56) References Cited

U.S. PATENT DOCUMENTS

| | | | |
|---|---|---|---|
| 6,084,262 A | 7/2000 | Chi | |
| 6,151,249 A | 11/2000 | Shirota | |
| 6,240,015 B1 | 5/2001 | Chi | |
| 6,690,601 B2 * | 2/2004 | Yeh ..... | G11C 16/0475 257/E21.209 |
| 6,872,609 B1 | 3/2005 | Kamal | |

(Continued)

OTHER PUBLICATIONS

Taiwan Office Action, Application No. 104101359, mailed Feb. 17, 2016, 18 pages.

(Continued)

*Primary Examiner* — Son Mai
*Assistant Examiner* — Muna A Techane
(74) *Attorney, Agent, or Firm* — Meyertons, Hood, Kivlin, Kowert & Goetzel, P.C.

(57) ABSTRACT

A device includes a memory and a read/write (R/W) unit. The memory includes multiple gates coupled to a common charge-trap layer. The R/W unit is configured to program and read the memory by creating and reading a set of electrically-charged regions in the common charge-trap layer, wherein at least a given region in the set is not uniquely associated with any single one of the gates.

20 Claims, 3 Drawing Sheets

(56) References Cited

U.S. PATENT DOCUMENTS

| | | | |
|---|---|---|---|
| 7,106,625 B2* | 9/2006 | Yeh | H01L 27/115 |
| | | | 257/E21.423 |
| 7,151,293 B1 | 12/2006 | Shiraiwa | |
| 7,209,386 B2 | 4/2007 | Yeh | |
| 7,675,787 B2* | 3/2010 | Lung | G11C 16/0475 |
| | | | 365/185.03 |
| 7,678,674 B1* | 3/2010 | Sinha | H01L 21/26586 |
| | | | 257/E21.147 |
| 7,936,005 B2 | 5/2011 | Okamura | |
| 8,064,259 B2 | 11/2011 | Lee | |
| 8,068,370 B2 | 11/2011 | Lue | |
| 8,319,276 B2 | 11/2012 | Nakanishi | |
| 8,395,942 B2 | 3/2013 | Samachisa | |
| 8,551,858 B2 | 10/2013 | Fang | |
| 8,847,302 B2 | 9/2014 | Alsmeier | |
| 2006/0007742 A1* | 1/2006 | Yeh | G11C 16/0483 |
| | | | 365/185.18 |
| 2009/0292973 A1 | 11/2009 | Seol | |
| 2010/0074013 A1 | 3/2010 | Joo | |
| 2012/0099377 A1 | 4/2012 | Maejima | |
| 2012/0272017 A1 | 10/2012 | Lee | |

OTHER PUBLICATIONS

International Preliminary Report on Patentability, Application No. PCT/US2015/010551, issued Jul. 28, 2016.
International Search Report & Written Opinion, Application No. PCT/US2015/010551, issued Mar. 30, 2015, 14 pages.

* cited by examiner

STORAGE IN CHARGE-TRAP MEMORY STRUCTURES USING ADDITIONAL ELECTRICALLY-CHARGED REGIONS

CROSS-REFERENCE TO RELATED APPLICATIONS

This application is a continuation of U.S. patent application Ser. No. 14/457,380 filed Aug. 12, 2014 which claims the benefit of U.S. Provisional Patent Application 61/927,593, filed Jan. 15, 2014, whose disclosure is incorporated herein by reference.

TECHNICAL FIELD

Embodiments described herein relate generally to memory devices, and particularly to methods and systems for data storage in non-volatile memory cells.

BACKGROUND

Various types of Charge-Trap (CT)-based memory devices, such as Silicon-Oxide-Nitride-Oxide-Silicon (SONOS)-based non-volatile memory (NVM) devices, are known in the art. For example, U.S. Pat. No. 8,395,942, whose disclosure is incorporated herein by reference, describes a method to form a plurality of charge storage regions over a tunneling dielectric layer and undercutting a channel using the plurality of charge storage regions as a mask.

U.S. Pat. No. 6,151,249, whose disclosure is incorporated herein by reference, describes NAND-type EEPROM having bit lines and source lines commonly coupled through enhancement and depletion transistors. U.S. Patent Application Publication 2010/0252877, whose disclosure is incorporated herein by reference, describes a non-volatile memory device, which comprises a word line disposed on a substrate, an active region crossing over the word line, and a charge trap layer that is between the word line and the active region.

U.S. Pat. No. 5,768,192, whose disclosure is incorporated herein by reference, describes a non-volatile semiconductor memory cell utilizing asymmetrical charge trapping. The patent describes programming and reading a programmable read only memory (PROM) having a trapping dielectric sandwiched between two silicon dioxide layers that greatly reduces the programming time of conventional PROM devices.

U.S. Pat. No. 8,068,370, whose disclosure is incorporated herein by reference, describes a charge trapping floating gate with asymmetric tunneling barriers. U.S. Pat. No. 7,209,386, whose disclosure is incorporated herein by reference, describes a multiple-gate memory cell, which comprises a semiconductor body and a plurality of gates arranged in series on the semiconductor body. A charge storage structure on the semiconductor body includes charge trapping locations beneath gates in the plurality of gates.

SUMMARY

An embodiment that is described herein provides a device including a memory and a read/write (R/W) unit. The memory includes multiple gates coupled to a common charge-trap layer. The R/W unit is configured to program and read the memory by creating and reading a set of electrically-charged regions in the common charge-trap layer, wherein at least a given region in the set is not uniquely associated with any single one of the gates.

In some embodiments, the R/W unit is configured to create the given region by applying programming voltages to multiple gates simultaneously. In other embodiments, the R/W unit is configured to control a position of the given region relative to the gates by setting respective amplitudes of the voltages applied to the multiple gates. In yet other embodiments, the R/W unit is configured to read data from the given region by applying read voltages to multiple gates simultaneously.

In an embodiment, the given region is created during a manufacturing process of the device. In another embodiment, the R/W unit is configured to create the given region for improving charge retention in adjacent electrically-charged regions whose charge levels represent stored data. In yet another embodiment, the R/W unit is configured to modify a thermal coefficient of the device by changing an amount of electrical charge in the given region.

In some embodiments, the R/W unit is configured to modify an amount of electrical charge in the given region during a lifetime of the memory. In other embodiments, the R/W unit is configured to store data in the given region by creating in the given region an electrical charge level representing the data. In yet other embodiments, the R/W unit is configured to store data in the given region by positioning the given region at a location in the common charge-trap layer that represents the data.

In an embodiment, the R/W unit is configured to create a first number of the electrically-charged regions that is larger than a second number of the gates formed over the common charge-trap layer. In another embodiment, the R/W unit is configured to create the electrically-charged regions with a first average spacing that is smaller than a second average spacing between the gates formed over the common charge-trap layer. In yet another embodiment, the R/W unit is configured to create the electrically-charged regions by applying programming voltages to transistor terminals other than the gates.

There is additionally provided, in accordance with an embodiment, a method including providing a memory that includes multiple gates coupled to a common charge-trap layer. The memory is programmed and read by creating and reading a set of electrically-charged regions in the common charge-trap layer, wherein at least a given region in the set is not uniquely associated with any single gate.

DETAILED DESCRIPTION OF EMBODIMENTS

Overview

Non-volatile memory (NVM) devices are used in various storage applications and required to provide high storage capacity and high operational reliability. The structure of a NVM may be planar as in traditional two-dimensional (2D) NAND Flash memory devices, or vertical as proposed in new three-dimensional (3D) Flash structures.

Embodiments that are described hereinbelow provide improved methods and systems for storing data in memory devices. In some embodiments, the disclosed techniques improve memory storage in a charge-trap (CT)-based NVM device by using additional electrically-charged regions, which are not uniquely associated with any single control gate. The CT-based NVM device comprises multiple control gates that are formed over a common CT layer. The control gates are connected to a read/write (R/W) unit, which applies appropriate voltages to the control gates to program or read data in the memory.

In some embodiments, the R/W unit creates and reads electrically-charged regions within the charge-trap layer, which are not uniquely associated with any single control gate. In other words, the disclosed techniques break the traditional one-to-one relationship between control gates and memory cells or electrically-charged regions. This concept can be used, for example, for increasing data storage density and for reducing charge dissipating over time.

In some embodiments, the disclosed techniques may be applied to improve the memory cells charge retention (and hence, reliability), by programming electrically-charged regions between adjacent memory cells. In these embodiments, the electrically-charged regions do not store data but rather form boundaries in the CT layer between adjacent memory cells. In other embodiments, the electrically-charged regions may be programmed to increase the memory capacity of the CT-based NVM device, instead or in addition to traditional memory cells located under the control gates.

In an embodiment, the R/W unit creates an electrically-charged region that is not associated with a given control gate by applying programming voltages to multiple control gates simultaneously. Readout from such regions is performed in a similar manner. In alternative embodiments, some or all of the electrically-charged regions may be formed during the device manufacturing process.

In other embodiments, data values are represented by the location of the charge region in the charge-trap layer (either instead of or in addition to the amount of charge in the region). The R/W unit can create charge regions in different locations, for example, by adjusting the relations between the voltages applied to adjacent gates. The total applied voltage may remain constant.

In alternative embodiments, a combination of different location and different amount of charge creates additional regions. This combination further increases the storage density of the memory device.

System Description

Figure 1:
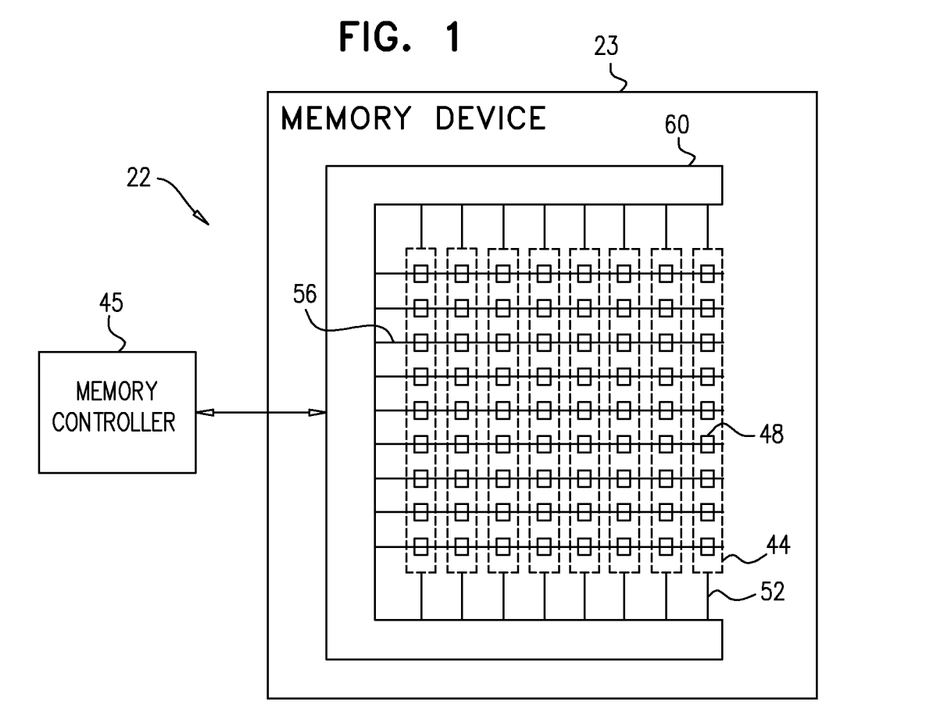
FIG. 1 is a block diagram that schematically illustrates a memory system, in accordance with an embodiment.

FIG. 1 is a block diagram that schematically illustrates a memory system 22 comprising a memory device 23 and a memory controller 45, in accordance with an embodiment. Memory device 23 comprises multiple cascades 44 of control gates 48. The first or last control gate in each cascade 44 is connected to a respective bit line 52. The control gates of corresponding control gates 48 in the various cascades are connected to respective word lines 56.

In the embodiments described herein, the data is stored in the memory by creating electrically-charged regions in a common isolating layer, so as to form respective memory cells. One typical example is CT NAND Flash memory. The techniques described herein can be used with various other types of memory, such as CT NOR Flash, or various kinds of Silicon-Oxide-Nitride-Oxide-Silicon (SONOS), Metal-Oxide-Nitride-Oxide-Silicon (MONOS) or Titanium-Alumina-Nitride-Oxide-Silicon (TANOS) memory. Several examples in this disclosure are related to SONOS-based NVMs, however the techniques described herein are applicable for any kind of CT-based NVM devices.

A Read/Write (R/W) unit 60 controls the bit lines and word lines so as to program, read and erase memory cells, using methods that are described in detail below. R/W unit 60 is typically connected to a memory controller 45 or host, for receiving data for storage in the memory and for sending data retrieved from memory.

The configuration of memory system 22 shown in FIG. 1 is an example configuration, which is chosen purely for the sake of conceptual clarity. In alternative embodiments, any other suitable configuration can be used for implementing the memory system, and in particular for implementing memory device 23. Certain elements of memory system 22 can be implemented using hardware, such as using one or more Application-Specific Integrated Circuits (ASICs) or Field-Programmable Gate Arrays (FPGAs) or other device types. Additionally or alternatively, certain elements of memory system 22 can be implemented using software, or using a combination of hardware and software elements.

Memory controller 45 typically comprises a general-purpose computer, which is programmed in software to carry out the functions described herein. The software may be downloaded to the computer in an electronic form, over a network, for example, or it may, alternatively or additionally, be provided and/or stored on non-transitory tangible media, such as magnetic, optical, or electronic memory.

Additional Charged Regions in Common CT Layer

A typical 2D CT-based NVM, such as a Silicon-Oxide-Nitride-Oxide-Silicon (SONOS) based a NAND NVM device, comprises a stack of layers on a well. The stack comprises a tunnel oxide layer underneath a nitride layer (also known as a blocking layer), which is underneath another oxide layer (known as gate oxide). Control gates, typically made of a polycrystalline silicon (also known as "Poly-silicon"), are formed on top of the stack. Data is stored in the memory by storing electrical charge in the blocking (i.e., nitride) layer below the control gates.

In a typical 3D NAND configuration, the charge-trap nitride layer is located vertically between the tunnel oxide layer and the gate oxide layer. The control gates are formed on the edge of the stack and are coupled to the gate oxide layer. The different description of the 2D and 3D NAND devices are related to the horizontal and vertical structures of 2D and 3D NAND, respectively. The description hereinbelow (which is usually 2D oriented) is equally applicable to both 2D and 3D NAND configurations.

Embodiments that are described herein provide improved methods and systems for data storage in NVM. The disclosed techniques form and utilize regions of electrical charge at any desired location in the nitride layer, not necessarily under a given control gate and not necessarily associated with any individual control gate. The charged regions may be formed during device operation, by applying pertinent voltages on the device, or, by charging predefined regions during the production process of the NVM device. Although the embodiments described herein refer mainly to CT-based NAND memory cells, the disclosed techniques can be used in other suitable types of memory cells.

In some embodiments, the disclosed techniques may be used to increase the storage density (i.e., higher number of bits per a given cascade 44) by adding charged regions that are not directly under a given control gate 48, for example at different locations under the gate, between gates, or between R/W unit 60 and cascades 44, or at any other suitable location within memory device 23.

In other embodiments, the disclosed techniques may be used for improving charge retention in the NVM. In a CT-based NVM, electrical charge tends to spread over time due to electrical rejection force between charges with same polarity. Gradually, as the charge spreads, threshold voltages of the memory cells change and degrade the retention performance of the memory, causing read errors and loss of data. In this embodiment, the disclosed techniques reduce charge spreading from the designated charge regions by filling a potential charge gradient that may be created between control gates 48 with a corresponding charge. These additional charged regions function as boundary regions that retain the charge within the regions designated for the memory cells and keep the stability of their (SLC or MLC) programming states.

The embodiments above are described purely by way of example. In alterative embodiments, R/W unit 60 may create any other suitable type of intermediate charge regions for other kinds of charge management in NVM memory devices.

Figure 2:
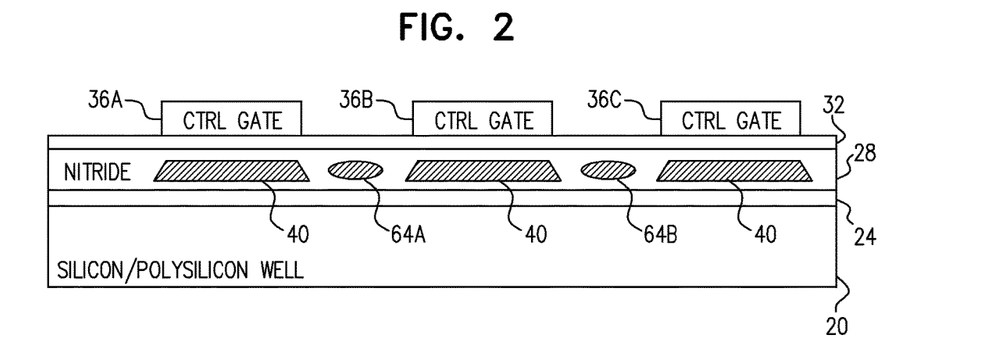
FIGS. 2-4 are sectional views of a SONOS-based NVM, in accordance with embodiments.

FIG. 2 is a sectional view of a SONOS-based NAND NVM, in accordance with an embodiment. The figure shows three adjacent control gates 36A . . . 36B along a given cascade 44. The NAND NVM is fabricated on a well 20, typically made of a silicon wafer or poly silicon or any other suitable material. The memory comprises an oxide layer 24 (referred to as tunnel oxide), a nitride layer 28 (or any other blocking layer) and another oxide layer 32 (referred to as gate oxide). Control gates 36 are typically made of Polysilicon. The region underneath each control gate in the present example functions as a NVM cell. Data is stored in a memory cell by storing electrical charge 40 in nitride layer 28, underneath the control gate. The quantity (and/or polarity) of the electrical charge is indicative of the stored data value.

A given memory cell is typically programmed with charge by applying one or more high voltage pulses (e.g., ~20V) to the control gate of that cell. The control gates of the neighboring cells are typically biased with lower voltage (e.g., ~5V) during programming.

Readout from a given memory cell is typically performed by applying a suitable read voltage ($V_R$) to the control gate of the cell, applying to the other controls gates pass voltages ($V_{pass}$) that cause the other cells to conduct, and sensing the conductivity of the cascade of memory cells using voltage or current sensing. Erasure of a memory cell is typically performed by applying a high positive voltage to the well while the control gate is grounded.

For example in FIG. 2, in order to read data stored in the memory cell underneath control gate 36B, R/W unit 60 may apply a read voltage to control gate 36B and pass voltages ($V_{pass}$) to control gates 36A and 36C.

FIG. 2 shows only three control gates 36A-36C (and hence three memory cells) for the sake of clarity. In real-life memory devices, however, any suitable number of memory cells can be used.

In addition, R/W unit 60 creates additional intermediate regions of electrical charge, within nitride layer 28 and between adjacent control gates. In FIG. 2, for example, an intermediate charge region 64A is formed between control gates 36A and 36B, and an intermediate charge region 64B is formed between control gates 36B and 36C. Charge regions 64A and 64B are used for preventing electrical charge 40 from spreading over time from the region located underneath control gate 36B.

As a result, the retention performance of the memory improves considerably. The charge quantity in intermediate regions 64A and 64B is typically data-independent, and in this embodiment, its sole purpose is to reduce or prevent charge drift from regions 40.

In some embodiments, R/W unit 60 forms the intermediate charge regions (e.g., regions 64A and 64B) before the memory cells are programmed (i.e., before charge regions 40 are created). In an example embodiment, R/W unit 60 may form charge regions 64A and 64B immediately after erasure of the memory beneath control gate 36B, by applying one or more high-voltage (e.g., 15V) programming pulses to all the control gates. In another embodiment, the intermediate charge regions (e.g., regions 64A and 64B) are formed during production and the charge is not removed by subsequent data programming and erasure operations.

R/W unit 60 may form charge regions 64A and 64B using any suitable technique. For example, if the nominal pulse magnitude for programming the memory cells is 20V, R/W unit 60 may form an intermediate charge region by applying slightly lower-voltage pulses to multiple control gates.

For example, region 64A can be created by simultaneously applying 15V pulses to control gates 36A and 36B, which are located on either side of the desired location of the intermediate charge region. This pulse magnitude is too low for programming the region underneath the control gate, but the combination of pulses from the two control gates is sufficiently high for creating intermediate charge region 64A. Similarly, R/W unit 60 may create region 64B by applying 15V pulses to control gates 36B and 36C simultaneously. Alternatively, the R/W unit may use any other suitable method for creating the intermediate charge regions. The pulses described above are examples that should typically be accompanied with a proper design of the device architecture, e.g., a pulse voltage should be adapted to the physical distance between two adjacent control gates.

In the example of FIG. 2, each intermediate charge region is located around the mid-point between two control gates. In alternative embodiments, the R/W unit may create intermediate charge regions at unequal distances from the adjacent control gates, for example by applying unequal-magnitude pulses to the control gates. For example, applying a 20V pulse to control gate 36A and a 10V pulse to control gate 36B would create charge region 64A closer to control gate 36A.

In an alternative embodiment, multiple intermediate charge regions may be formed between adjacent memory cells. For example, applying a 20V pulse to control gate 36A and a 10V pulse to control gate 36B would create a first charge region 64A closer to control gate 36A, and subsequently by applying a 10V pulse to control gate 36A and a 20V pulse to control gate 36B would create a second intermediate charge region (between control gates 36A and 36B) like 64A, however, this region would be located closer to control gate 36B.

The performance and reliability of NAND devices typically degrade over time. In yet another embodiment, the R/W unit may modify the amount of intermediate charge between cells during the NAND life time in order to provide improved performance and reliability.

For example, adding a large amount of intermediate charge between cells requires relatively long programming operations, which negatively affects the device speed performance. In an embodiment, in the early stages of a NAND device lifetime, the R/W unit inserts only a small amount of intermediate charge, which is sufficient to guarantee the charge retention, and thus, the negative effect on device programming speed is minimal. After a certain period (e.g., after 100,000 program/erase cycles in a SLC), the CT layer of the device ages and requires improved data retention. Data retention at this stage is achieved by the R/W unit applying a larger amount of intermediate charge, and the device performance is slowed accordingly.

In another embodiment, the R/W unit can control a thermal coefficient of device 23 (which affects the $V_{pass}$ and other properties of the device) by controlling the amount of charge in the intermediate charge regions. Thus, control of the amount of intermediate charge provides memory controller 45 with a degree of freedom to manage the thermal coefficient of the device.

The embodiments above are described purely by way of example. In alterative embodiments, R/W unit 60 may create any other suitable type of intermediate charge regions, in any other suitable way. In other embodiments, the disclosed techniques can also be used to implement a One-Time Programmable (OTP) memory.

Figure 3:
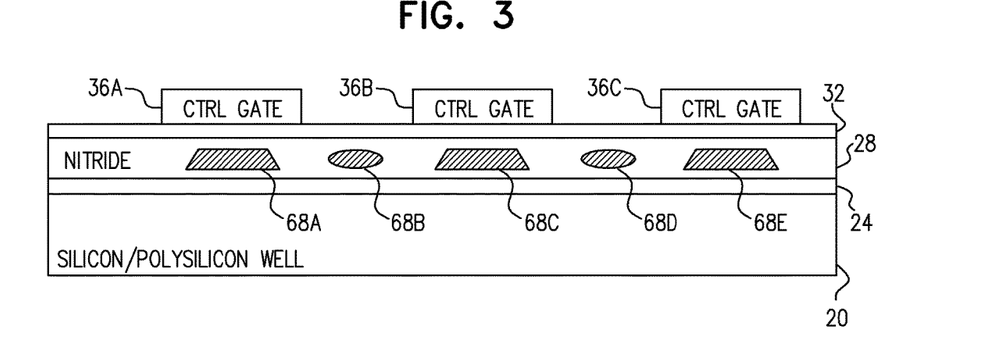

FIG. 3 is a sectional view of a SONOS-based NAND NVM, in accordance with an embodiment. In this configuration, R/W unit 60 programs the memory cells by creating electrical charge regions denoted 68A-68E in nitride layer 28. Some of the charge regions are created by applying programming pulses to a single control gate. In the present example, region 68A is created by applying programming pulses to control gate 36A, region 68C is created by applying programming pulses to control gate 36B, and region 68E is created by applying programming pulses to control gate 36C.

Other charge regions are created by applying programming pulses to multiple control gates simultaneously. In the present example, region 68B is created by applying programming pulses simultaneously to control gates 36A and 36B. Region 68D is created by applying programming pulses simultaneously to control gates 36B and 36C. In the example of FIG. 3, charge regions 68B and 68D are located around the mid-points between two adjacent control gates.

In alternative embodiments, R/W unit 60 may create charge regions that hold data, such as 68B and 68D, different amounts of charge can be used to differentiate between different data states, at unequal distances from the adjacent control gates, for example by applying unequal magnitude of pulses to the control gates.

In another embodiment, R/W unit 60 may create multiple charge regions between two adjacent memory cells by applying a sequence of simultaneous sets of pulses to adjacent control gates.

In some embodiments, the data represented by charge regions 68A, 68C and 68E may be read by sensing the respective bit lines. The data represented by charge regions 68B and 68D may be read by combining the sensed outputs of multiple bit lines.

As can be seen in FIGS. 2-3, and appreciated from the description above, some of the charge regions in nitride layer 28 (e.g., regions 64A and 64B in FIG. 2 and regions 68B and 68D in FIG. 3) are not uniquely associated with any single control gate.

In this embodiment, the number of the electrically-charged regions that store data is larger than the number of control gates. Put in another way, the electrically-charged regions that store data are distributed along the common CT layer with an average spacing that is smaller than the average spacing between control gates.

Figure 4:
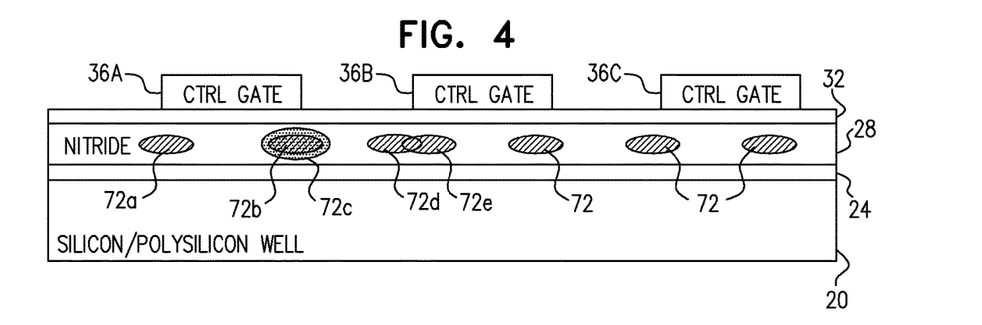

FIG. 4 is a sectional view of a SONOS-based NAND NVM, in accordance with an embodiment. In this configuration, R/W unit 60 programs the memory with data by creating multiple electrical charge regions 72 in nitride layer 28.

In this example, none of the charge regions is associated with any single control gate. R/W unit 60 creates each charge region 72 by applying programming pulses simultaneously to multiple (e.g., two) control gates simultaneously. By appropriate setting of the programming pulses, R/W unit 60 is able to configure the location, size, charge distribution and charge level of each region 72. For example, by applying a 22V pulse to control gate 36A and an 11V pulse to control gate 36B, the size of corresponding region 72C is larger compared to a region 72B obtained by applying an 18V pulse to control gate 36A and a 9V pulse to control gate 36B, however, the center of both regions 72 is expected to be at the same location, closer to control gate 36A In this embodiment, R/W unit 60 is able to control the exact location of the charged region within nitride layer 28. In the example presented at FIG. 4, a region 72E is closer to control gate 36B than a region 72D. Region 72D is obtained by applying an 18V pulse on control gate 36B and a 12V pulse on control gate 36A, while region 72E is obtained by applying a 22V pulse on control gate 36B and an 8V pulse on control gate 36A. In this example, the size of both regions is the same due to the same total voltage applied by R/W unit 60 (30V in this example). Region 72E, however, is closer to control gate 36B due to the higher voltage pulse applied by R/W unit 60 on this control gate.

Similarly, by appropriate combination of bit-line sensing, R/W unit 60 is able to read the data represented by the various charge regions.

The charge region constellations and the programming and readout schemes shown in FIGS. 2-4 above are depicted purely by way of example. In alternative embodiments, any other suitable charge region constellation and any other suitable programming and readout scheme can be used.

The examples in FIGS. 3 and 4 describe embodiments in which the amount of trapped charge in a given region represents a given data value. In other embodiments, the data values are represented by respective locations of the charged region in the CT layer. Charge location can be measured, for example, by the position of a center of gravity of 90% of the charge in a given region, or by any other suitable measure. For example, in a nominal state, R/W unit 60 programs device 23 with regions 72, 72A, 72B, and 72D, as shown in FIG. 4. In this example, charged region 72D is obtained by applying 18V on gate 36A and 12V on gate 36B.

In an embodiment, R/W unit 60 predefines a set of possible locations in the CT layer for a given charged region, each location in the set representing a respective data value. The R/W unit programs a given data value by creating the charged region in the location which corresponds to that given data value.

Accordingly, R/W unit 60 sets a different location of region 72E (with respect to 72D) by changing the applied voltage on gate 36A, from 18V to 22V, and the voltage on gate 36B, from 12V to 8V. In this embodiment, the total amount of voltage remains substantially constant (e.g., 30V), and thus, the amount of charge is identical, however each region represents a different data value.

In another embodiment, the disclosed techniques may be applied to provide a combination of a different location and a different charge amount. This combination enables additional data values in a given area, and thus, achieves a higher storage density in this areas.

For example, the disclosed techniques can be applied to modify the charge between regions 72B and 72C. In this example, R/W unit 60 changes the voltage applied on gate 36A from 18V to 22V, and the voltage applied on gate 36B from 9V to 11V. As a result, the amount of charge increases (e.g., region 72C is larger than region 72B), so as to locally change the data value in device 23.

In other embodiments, the R/W unit programs device 23 by applying voltage on other terminals (rather than the control gate) of the device, such as on the source or drain terminals, in order to create charged regions in the CT layer.

Additional Readout Considerations

Device 23 may comprise a Single-Level Cell (SLC) device, which comprises one bit per cell, and thus, two programming levels, or a Multi-Level Cell (MLC) device comprising two bits per cell, and more than two programming levels. The description that follows refers mainly to Single-Level Cell (SLC) NVM, for the sake of clarity. The principles described below can be used, however, in Multi-Level Cell (MLC) NVM, as well A SLC NVM may be erased or programmed, and such a cell may be read using a read voltage $V_R$ that is set between the erased and programmed levels. When a given cell is read using the above scheme, the other cells in the structure are biased so as to conduct regardless of their programming status (programmed or erased), by applying a pass voltage $V_{pass}$.

Consider now the disclosed techniques that place an additional intermediate charge region S between adjacent memory cells C1 and C2 (for storing data in addition to the individual programming of each cell). (Referring to the example of FIG. 3 above, cells C1 and C2 correspond to control gates 36A and 36B, respectively, and intermediate charge region S corresponds to charge region 68B.) The intermediate charge region S causes a shift in the cell voltage of C1, and thus requires a higher pass voltage.

Figure 5A:
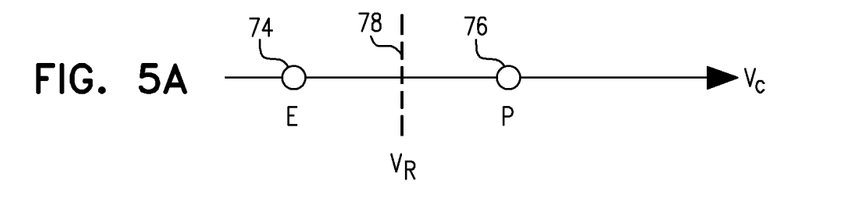
FIGS. 5A and 5B are diagrams showing threshold voltage levels in a Single-Level Cell (SLC) NVM, in accordance with an embodiment.

FIG. 5A is a diagram showing threshold voltage levels of a SLC NVM without intermediate charge regions, in accordance with an embodiment o. As mentioned above, for a given cell, a read voltage $V_R$ 78 is set between an erased level 74 (marked as "E") and a programming level 76 (marked as "P").

Figure 5B:
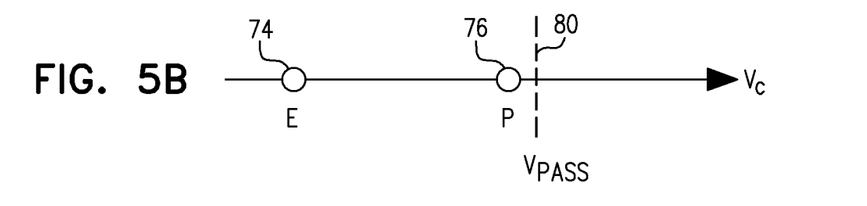

FIG. 5B is a diagram showing threshold voltage levels of a SLC NVM without intermediate charge regions, in accordance with an embodiment. When a given cell is read using the FIG. 5B scheme, the other cells in the structure are biased so as to conduct regardless of their programming status (programmed or erased), by applying a pass voltage $V_{pass}$ 80, which is set at a higher voltage level than programming level 76 (marked as "P").

Figure 5C:
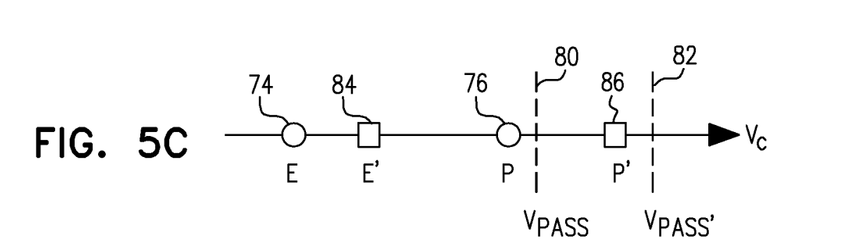
FIG. 5C is a diagram showing threshold voltage levels in a SLC NVM with intermediate electrically-charged regions, in accordance with an embodiment.

FIG. 5C is a diagram showing threshold voltage levels of a SLC NVM with intermediate charge regions, in accordance with an embodiment o. In FIG. 5C, erased level E74 and programming level P 76 are marked with circles when no intermediate charge region is present in nitride layer 28. A pass voltage $V_{pass}$ 80 for this scenario is marked $V_{pass}$. Levels E' 84 and P' 86 (marked with squares) denote the erased and programming levels respectively when intermediate charge region S is present between cells C1 and C2. The pass voltage for this scenario is marked $V_{pass}'$ 82.

As shown in FIG. 5C, the formation of intermediate charge regions shifts the programming and erased levels from erased level E 74 and programming level P 76 to erased level E' 84 and programming level P' 86, respectively. As a result, R/W unit 60 typically adjusts the setting of the pass voltage, from pass voltage $V_{pass}$ 80 to pass voltage $V_{pass}'$ 82.

Figure 6:
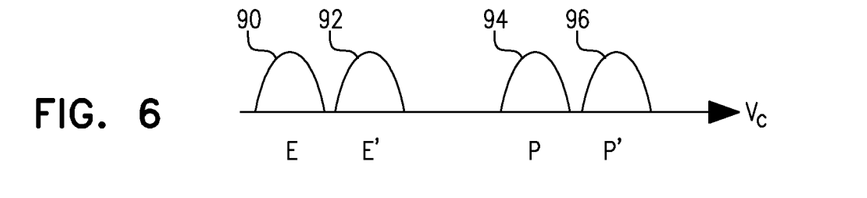
FIG. 6 is a diagram showing threshold voltage distribution in a group of SLC NVM memory cells with intermediate electrically-charged regions, in accordance with an embodiment.

FIG. 6 is a diagram showing a threshold voltage distribution in an array of SLC NVM with intermediate charge regions, in accordance with an embodiment. Erased level E 90 and programming level P 94 represent the distribution of the erased and programming levels respectively, without intermediate charge regions. Erased level E' 92 and programming level P' 96 represent the distribution of the erased and programming levels respectively, in the presence of intermediate charge regions. This distribution may be caused by variations induced during the device manufacturing process, by impairments in the programming and/or erasure processes, by threshold voltage drift over time, or for any other reason.

When considering a group of memory cells rather than a single cell, the two possibilities (presence or absence of intermediate charge regions) produces a total of four possible programming- and erased-level distributions instead of two (e.g., E, E', P, P' instead of E, P). Typically, the data represented by the intermediate charge region S is read by biasing the other cells in the structure (other than C1 and C2) using $V_{pass}'$, as in FIG. 5C.

Readout of S by R/W unit 60 can be performed in several ways. In one embodiment, cell C2 is read using $V_R$ while $V_{pass}'$ is applied to cell C1, such that $V_{pass}'>V_{pass}$. In another embodiment, a combination of read voltages is applied to both C1 and C2, for example by applying $V_{pass}$ to C1 and $V_R$ to C2. The net effect of the two implementations on S is similar.

Consider now the case of three adjacent cells C1, C2 and C3 (e.g., control gates 36A-36C of FIG. 3), wherein an intermediate charge region S1 (e.g., charge region 68B of FIG. 3) is formed between C1 and C2, and an intermediate charge region S2 (e.g., charge region 68D of FIG. 3) is formed between C2 and C3. An underlying assumption is that intermediate charge region S1 is more closely associated with one of cells C1 and C2. In other words, the assumption is that when reading C1 and C2, it is possible to identify whether S1 or S2 is present.

If the above condition does not hold, a possible solution is to form an intermediate charge region only every two cells. For example, for a cascade of memory cells C1,C2, . . . , C8, intermediate charge regions (that store additional data) are formed only between C1 and C2, between C3 and C4, between C5 and C6, and between C7 and C8.

It will thus be appreciated that the embodiments described above are cited by way of example, and that these embodiments are not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

What is claimed is:

1. An apparatus, comprising:
   a plurality of memory cells, wherein each memory cell of the plurality of memory cells includes a respective control gate of a plurality of control gates, and wherein each control gate of the plurality of control gates is coupled to a common charge-trap layer; and
   a control circuit configured to:
      create a first electrically-charged region in a first portion of the charge-trap layer located between a first control gate and a second control gate of the plurality of control gates;
      receive a plurality of data bit values to be stored in the plurality of memory cells;
      store a first data bit value of the plurality of data bit values by creating a second electrically-charged region in a second portion of the charge-trap layer corresponding to the first control gate; and
      store a second data bit value of the plurality of data bit values by creating a third electrically-charged region in a third portion of the charge-trap layer corresponding to the second control gate;
      wherein the first electrically-charged region is configured to reduce or prevent charge drift from the second and third electrically-charged regions.

2. The apparatus of claim 1, wherein to create the first electrically-charged region in the first portion of the charge-trap layer, the control circuit is further configured to create the first electrically-charged region in the charge-trap layer prior to receiving the plurality of data bit values.

3. The apparatus of claim 1, wherein the control circuit is further configured to position the first electrically-charged region by applying a first voltage level to the first control gate and a second voltage level to the second control gate, wherein the first voltage level is greater than the second voltage level.

4. The apparatus of claim 3, wherein the control circuit is further configured to create a fourth electrically-charged region in a fourth portion of the charge-trap layer associated with the first control gate and the second control gate, and wherein to create the fourth electrically-charged region the control circuit is further configured to position the fourth electrically-charged region by applying a third voltage level to the second control gate and a fourth voltage level to the first control gate, wherein the third voltage level is greater than the fourth voltage level.

5. The apparatus of claim 1, wherein the control circuit is further configured discharge the second electrically-charged region and discharge the third electrically-charged region while maintaining charge stored in the first electrically-charged region.

6. The apparatus of claim 1, wherein the control circuit is further configured to adjust an amount of charge in the first electrically-charged region, wherein the amount of charge is dependent upon an indication of an amount of wear of the charge-trap layer.

7. The apparatus of claim 6, wherein the indication includes information indicative of a number of program and erase cycles associated with the first control gate and the second control gate.

8. A method, comprising:
   creating a first electrically-charged region in a first portion of a charge-trap layer located between a first control gate and a second control gate of a plurality of control gates, wherein each of the plurality of control gates corresponds to a respective one of a plurality of memory cells, and wherein each of the plurality of control gates is coupled to a common charge-trap layer;
   receiving a plurality of data bit values to be stored in the plurality of memory cells;
   storing a first data bit value of the plurality of data bit values by creating a second electrically-charged region in a second portion of the charge-trap layer corresponding to the first control gate; and
   storing a second data bit value of the plurality of data bit values by creating a third electrically-charged region in a third portion of the charge-trap layer corresponding to the second control gate;
   wherein the first electrically-charged region is configured to reduce or prevent charge drift from the second and third electrically-charged regions.

9. The method of claim 8, wherein creating the first electrically-charged region in the first portion of the charge-trap layer further comprises creating the first electrically-charged region in the charge-trap layer prior to receiving the plurality of data bit values.

10. The method of claim 8, further comprising positioning the first electrically-charged region by applying a first voltage level to the first control gate and a second voltage level to the second control gate, wherein the first voltage level is greater than the second voltage level.

11. The method of claim 10, further comprising creating a fourth electrically-charged region in a fourth portion of the charge-trap layer associated with the first control gate and the second control gate, wherein creating the fourth electrically-charged region comprises positioning the fourth electrically-charged region by applying a third voltage level to the second control gate and a fourth voltage level to the first control gate, wherein the third voltage level is greater than the fourth voltage level.

12. The method of claim 8, further comprising discharging the second electrically-charged region and discharging the third electrically-charged region while maintaining charge in the first electrically-charged region.

13. The method of claim 8, further comprising adjusting an amount of charge in the first electrically-charged region, wherein the amount of charge is dependent upon an indication of an amount of wear of the charge-trap layer.

14. The method of claim 13, wherein the indication includes information indicative of a number of program and erase cycles associated with the first control gate and the second control gate.

15. A system, comprising:
   a memory device including a plurality of memory cell groups, wherein each of the plurality of memory cell groups includes a respective plurality of control gates and a respective common charge-trap layer, wherein the respective common charge-trap layer is coupled to each of the respective plurality of control gates; and
   a memory controller configured to issue memory operations to the memory device;
   wherein the memory device is configured to create a first electrically-charged region in a first portion of a given charge-trap layer in a respective memory cell group, wherein the first portion is located between a first control gate and a second control gate coupled to the given charge-trap layer;
   wherein the memory controller is further configured to send a program operation to the memory device, wherein the program operation includes a plurality of data bit values to be stored in the respective memory cell group;

wherein the memory device is further configured to store a first data bit value by creating a second electrically-charged region in a second portion of the given charge-trap layer, wherein the second portion corresponds to the first control gate; and store a second data bit value by creating a third electrically-charged region in a third portion of the given charge-trap layer, wherein the third portion corresponds to the second control gate; and wherein the first electrically-charged region is configured to reduce or prevent charge drift from the second and third electrically-charged regions.

16. The system of claim 15, wherein to create the first electrically-charged region in the first portion of the given charge-trap layer, the memory device is further configured to create the first electrically-charged region in the given charge-trap layer prior to receiving the program operation.

17. The system of claim 15, wherein the memory device is further configured to position the first electrically-charged region by applying a first voltage level to the first control gate and a second voltage level to the second control gate, wherein the first voltage level is higher than the second voltage level.

18. The system of claim 17, wherein the memory device is further configured to create a fourth electrically-charged region in a fourth portion of the given charge-trap layer associated with the first control gate and the second control gate, and wherein to create the fourth electrically-charged region, the memory device is further configured to position the fourth electrically-charged region by applying a third voltage level to the second control gate and a fourth voltage level to the first control gate, wherein the third voltage level is greater than the fourth voltage level.

19. The system of claim 15, wherein the memory device is further configured to discharge the second electrically-charged region and discharge the third electrically-charged region while maintaining charge stored in the first electrically-charged region.

20. The system of claim 15, wherein the memory device is further configured to adjust an amount of charge in the first electrically-charged region, wherein the amount of charge is dependent upon an indication of a number of program and erase cycles associated with the first control gate and the second control gate.

* * * * *